(12) United States Patent
Ouchi

(10) Patent No.: US 6,477,286 B1
(45) Date of Patent: Nov. 5, 2002

(54) INTEGRATED OPTOELECTRONIC DEVICE, AND INTEGRATED CIRCUIT DEVICE

(75) Inventor: Toshihiko Ouchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/613,624

(22) Filed: Jul. 11, 2000

(30) Foreign Application Priority Data

Jul. 16, 1999 (JP) .......................................... 11-202707

(51) Int. Cl.⁷ ................................................ G02B 6/12
(52) U.S. Cl. ............................. 385/14; 385/49; 385/88; 257/433; 257/81
(58) Field of Search ............................... 385/88–94, 49, 385/14; 359/152; 257/80–82, 98–100, 431–435

(56) References Cited

U.S. PATENT DOCUMENTS

| | | | | |
|---|---|---|---|---|
| 5,122,893 A | * | 6/1992 | Tolbert ........................ | 359/152 |
| 5,168,537 A | * | 12/1992 | Rajasekharan et al. ....... | 385/89 |
| 5,357,122 A | | 10/1994 | Okubora et al. .............. | 257/84 |
| 5,359,686 A | * | 10/1994 | Galloway et al. ............. | 385/49 |
| 5,432,630 A | * | 7/1995 | Lebby et al. ................. | 359/152 |
| 5,521,992 A | * | 5/1996 | Chun et al. ................... | 385/14 |
| 5,701,325 A | | 12/1997 | Ouchi et al. .................. | 372/96 |
| 5,834,841 A | * | 11/1998 | Suzuki ........................ | 257/433 |
| 5,835,646 A | | 11/1998 | Yoshimura et al. ........... | 385/14 |
| 5,837,561 A | * | 11/1998 | Kish, Jr. et al. .............. | 438/47 |
| 5,850,408 A | | 12/1998 | Ouchi et al. .................. | 372/27 |
| 6,046,096 A | | 4/2000 | Ouchi ........................ | 438/510 |
| 6,089,442 A | | 7/2000 | Ouchi ..................... | 228/180.1 |

FOREIGN PATENT DOCUMENTS

| | | |
|---|---|---|
| JP | 5-67770 | 3/1993 |
| JP | 9-96746 | 4/1997 |

* cited by examiner

Primary Examiner—John D. Lee
Assistant Examiner—Scott A Knauss
(74) Attorney, Agent, or Firm—Fitzpatrick, Cella, Harper & Scinto

(57) ABSTRACT

An integrated optoelectronic device includes an electric circuit unit, such as a bare chip of integrated electronic devices, and an optical device unit for performing at least a portion of the input and output of signals to and from the electronic circuit unit via optical signals. The electronic circuit unit and the optical device unit are packaged in a common package with contoured upper, lower and side surfaces, and the optical device unit is provided on a side surface of the package.

6 Claims, 14 Drawing Sheets

INTEGRATED OPTOELECTRONIC DEVICE, AND INTEGRATED CIRCUIT DEVICE

BACKGROUND OF THE INVENTION

1. Field of the Invention

This invention relates to an integrated optoelectronic device for constructing electronic equipment, and an integrated circuit device, and particularly to (i) an integrated optoelectronic device, wherein optical and electronic devices are integrated to transmit or receive signals via light or a mixture of electrical means and light, such as optical interconnections, (ii) its driving method, (iii) a method of wiring between a mixed optoelectronic substrate and the integrated optoelectronic device, and (iv) related structures.

2. Related Background Art

In recent years, the development of high-speed large scale integration (LSI) has been advanced as the speeds of computers, information processing and computer peripherals, such as displays and printers, have increased. At the same time, problems of signal delay, heat generation and electromagnetic radiation emission noise (EMI) due to the rapid switching rates of the circuits in the LSI chip, integrated circuit (IC) board, multi-chip-module (MCM), and the backplane of super computers, and connections between electronic devices such as boards, computers, peripheral equipment, and audio-visual (AV) apparatuses have proliferated. Solutions of those problems are, however, difficult. It is hence apparent that the inherent absolute physical limitations of electric wiring will be reached in the near future.

For the purposes of solving the problems in the electrical wiring, there has been developed a substrate using a micro strip-line of the Rambus system in a board, or a method of transmitting a low voltage differential signal with a small amplitude through a shield line between boards (low voltage differential signalling (LVDS)).

In the Rambus system, signal transmission of frequencies over 400 MHz has been achieved, and this system is planned to be introduced in a next generation personal computer (PC). There are, however, limitations to the manner of wiring, and the implementation and arrangement of pins on the side of LSI chips. Therefore, there are problems in that system in that the chip cost increases, the system is unsuitable for long wiring, and the size of the board increases due to the limitations as to a high density in multi-bit wiring since cross-talk must be eliminated.

In the LVDS method, high-speed serial transmission of about 1 Gbps using LVDS has been put into practice, but its range of use is restricted since the costs of its interface IC and cable are high.

As a potential method for solving the limitations inherent in electrical wiring, techniques of optical interconnections are under development. In an optical interconnection, an electric signal from the IC or the like is converted into an optical signal, the converted optical signal is transmitted through an optical channel, or "wiring", as used hereinbelow, such as a waveguide formed in a board, to an optical receiver in another IC or board, and the optical signal is reconverted into an electric signal. Such a system removes the problem of (i) signal delay due to the parasitic capacitance that appears in electric wiring, (ii) signal degradation resulting from an unstable ground, and (iii) emission of EMI radiating from the wiring, and the system is thus expected to be used in future wiring schemes. In the optical interconnection, portions of the O (optical)/E (electrical) and E (electrical)/O (optical) conversions and the waveguide are important, and therefore, it is critical how effectively a portion of the electric wiring can be replaced by the optical wiring at a reduced cost.

As a method of optical wiring, there exists, as disclosed in Japanese Patent Application Laid-Open No. 5(1993)-67770, a structure wherein an optoelectronic IC chip, with an optical device arranged in place of the pins of the IC chip, is implemented on an optical wiring substrate provided with a waveguide and a reflective mirror. FIG. 1 illustrates the structure. A light emitting device 1011 is provided on the bottom surface of an optoelectric IC chip 1004, an inclined portion 1005 acting as a reflective mirror is provided on an optical wiring substrate 1001, and an optical signal from the light emitting device 1011 is coupled to a waveguide (core) 1008 and then received by a light receiving device 1012 in another chip 1004. In this example, a manner of the optical coupling between the optical devices 1011 and 1012 and the waveguide 1008 is illustrated, but neither the specific integration method nor the driving method of the electric circuit portion 1010 or the optical devices 1011 and 1012 is described. There is further provided in the structure of FIG. 1 a reflective layer 1002, a protruded portion 1006, and a silicon-oxide layer 1007.

As a method of driving an optical device to achieve the optical wiring, the following method is disclosed in Japanese Patent Application Laid-Open No. 9(1997)-96746. As illustrated in FIG. 2A, a continuous-wave output from a laser diode 1101 is divided by a coupler formed of plane waveguides into portions whose number is the number of signal lines, and electric signals are converted to optical signals by optical modulators 1102 of the electric-field absorption type or optical switches of a Mach-Zehnder type, respectively. Each optical signal is received and converted to an electric signal by a photodetector (PD) 1103, and the electric signal is amplified by an amplifier 1104. In this case, the substrate is not complicated and there is no need to prepare a special IC for driving the optical device, since the electric wiring portion 1106 and the optical wiring portion 1105 in the transmitter are independently designed as illustrated in FIG. 2B and an electric wiring portion 1107 and an optical wiring portion in the receiver portion are independently designed as illustrated in FIG. 2C. This construction can be readily applied to any electronic equipment simply by placing the optical wiring portion on a conventional electric printed circuit board (PCB), or the like.

In the system depicted in FIGS. 2A to 2C, however, the thickness of the structure increases due to the optical wiring portion being provided separately from the electric circuit, as described above. Accordingly, the size is inevitably made larger, as compared with the mixed optoelectronic substrate of FIG. 1. Further, in the case of a multi-channel device, or plurality of high-performance devices, such as an optical modulator or an optical switch, the cost increases, and problems arise with respect to the reliability of the electrode contacts of the electric signal to the modulator, to implementation, and to cross-talk between the modulators. Furthermore, the optical loss is large since light is divided by the coupler and coupled to the optical modulator, or the like, and hence, the problem arises of the electric power required to sustain the output power of the laser.

In the system of FIG. 1, although the detailed device construction and method of implementation are not clearly shown, it seems that the optical device and the electric device are commonly packaged, that the size is decreased due to high-density integration, and that reliability of the wiring is improved. This system is, however, impractical because of the power required to drive an ordinary light emitting device (due to the large electrical currents involved), such as a light emitting diode (LED) or a semiconductor laser. Additionally, the integrated circuit is further complicated by the addition of an IC for driving the optical device.

SUMMARY OF THE INVENTION

It is an object of the present invention to provide a practical integrated optoelectronic device which is readily adaptable to an optical interconnection and whose electric power requirements, as well as cost, can be reduced, an integrated circuit device, and related structures and methods.

The present invention is generally directed to an integrated optoelectronic device which includes an electric circuit unit, such as a bare chip of integrated electronic devices, and an optical device unit for performing at least a portion of the signal input and output to and from the electric circuit unit via an optical signal. The electric circuit unit and the optical device unit are packaged in a common package having contoured upper, lower, and side surfaces, and the optical device unit is placed on the side surface of the package. In such a structure, the electric circuit unit, such as an LSI circuit, and the optical device unit for performing an O/E or E/O conversion, are commonly packaged, so that the optical wiring and the electric wiring can be arranged in a compact manner, with low power requirements and at a reduced cost. Furthermore, the length of the wiring can be shortened, and hence, signal delay and skew can be prevented.

The following more specific structures are possible in the above structure.

The optical device unit is optically coupled to an external waveguide at the side surface of the package. The optical device unit may comprise a surface light emitting device unit, such as a surface emitting laser. In this case, the arrangement of devices and wiring in the package can be facilitated, and the arraying of the optical devices can be readily attained. Further, when the integrated optoelectronic device is implemented on a plate having both an electric wiring substrate and a waveguide layer formed thereon, the light input/output surface of the optical device can be readily and accurately aligned with the end surface of the waveguide.

The optical coupling is conducted horizontally with respect to the integrated optoelectronic device. The integrated optoelectronic device can be constructed in such a manner so as to establish an electrical contact with an external electric wiring substrate at the lower surface of the package.

The integrated optoelectronic device may further comprise a driving circuit for controlling the unit of the optical device, as well as wiring means for electrically connecting the driving circuit to the optical device unit, and the driving circuit and the wiring means may also be packaged in the common package.

The package may include a base plate, and the electric circuit unit and the optical device unit may be fixed on the base plate in proximity to each other with the wiring means interposed therebetween. In this structure, the electric circuit unit will thus be fixed on a central portion of the base plate, and the optical device unit will be fixed on the peripheral portion of the base plate in proximity to the electric circuit unit with the wiring means interposed therebetween. In this case, the optical device unit may be fixed in such a manner that an input or an output of light in or from the optical device is performed in a direction, or plane, parallel to the base plate. Further, an exposed conductive portion for electrically connecting to an external electric wiring may be provided in a region between the optical device unit and the electric circuit unit.

Further, the optical device unit may include optical devices arranged in an array on a wiring substrate with separate electrodes of the optical devices being bonded to the wiring substrate in a flip-chip manner, the wiring substrate may be fixed to a structure commonly packaged with the electric circuit unit, and windows for transmitting light may be formed in the wiring substrate or in the structure, corresponding to the arrayed optical devices.

The arrayed optical devices may, for example, be surface emitting lasers sandwiched between the structure and the wiring substrate, and the surface emitting laser may have a structure in which its growth semiconductor substrate is removed with only its cavity layer, including a multi-layer reflective mirror and an active layer, remaining.

The type of the package may be a ball grid array (BGA) in which the electric circuit unit is bonded to a base plate and an array of solder balls is arranged on a structure bonded to a portion of the base plate around the electric circuit unit, and the optical device may be bonded to a side surface of the structure such that an input or an output of light to or from the optical device is performed at the side surface of the package.

The optical device may be a surface emitting laser, such surface emitting laser may be driven directly by the on-and-off switching of a CMOS buffer at an output stage of the driving circuit, and the driving current of the surface emitting laser may be controlled by a resistor inserted in the signal path in series with the surface emitting laser.

Further, the present invention is generally directed to an integrated circuit device which includes an integrated optoelectronic device including an electrode region formed on a central portion of its bottom surface and an optical device region formed around the electrode region, and a plate member including an electric wiring substrate with an optical wiring layer provided on the electric wiring substrate. The electrode region has a protruding configuration, the plate member has a recess, and the protruding configuration has a height corresponding to the thickness of the optical wiring layer, and is inserted in the recess.

The optical wiring layer may be provided on each of upper and lower surfaces of the electric wiring substrate, and the integrated optoelectronic device may be placed on each of the optical wiring layers.

The electric wiring substrate may have a through-hole waveguide for optically coupling the optical wiring layers to each other.

These advantages and others will be more readily understood in connection with the following detailed description of the more preferred embodiments in conjunction with the drawings.

BRIEF DESCRIPTION THE DRAWINGS

Figure 1:
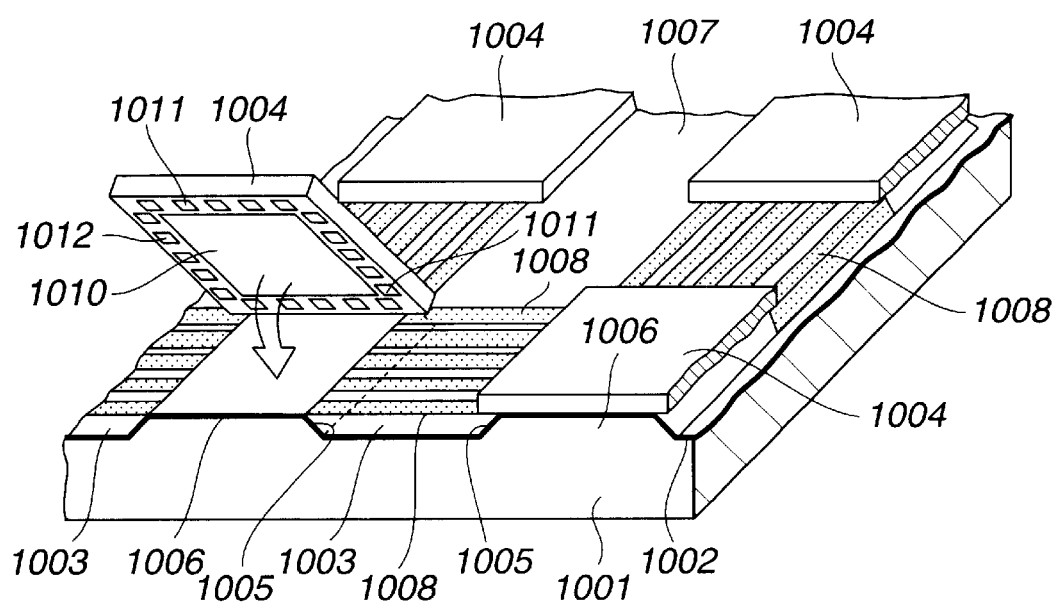
FIG. 1 is a perspective view of a first prior art device.

DESCRIPTION OF THE PREFERRED EMBODIMENTS (First Embodiment)

The first embodiment of the present invention is directed to an integrated optoelectronic device 6 now described with reference to FIG. 3. In the integrated optoelectronic device 6, a Si-LSI circuit is provided in a common package together with a surface emitting laser which can be driven at low power by a simple driver system, and thus both electrical and optical connections are achieved. The integrated optoelectronic device 6 is fit into a mixed optoelectronic substrate which consists of an optical wiring layer 2 and a multi-layer substrate 1 for electric wiring. The integrated optoelectronic device 6 is implemented with solder balls 10 in a BGA package. When the device 6 is implemented, optical devices 8 and 9, arrayed on side surfaces of the package, are simultaneously aligned with the input/output interfaces 12 of the optical wiring layer 2. In this structure, no reflective mirror is needed since light is input or output through the side surface of the waveguide 4.

Figure 9A:
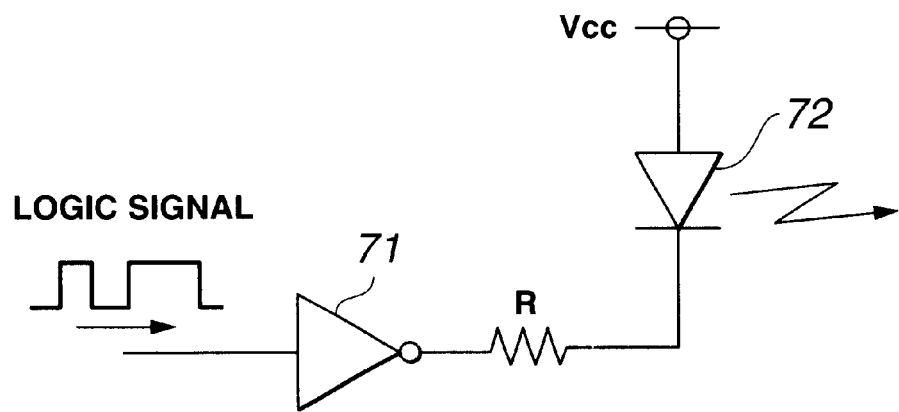
FIGS. 9A and 9B are schematic diagrams illustrating various driving methods of a light emitting device for the integrated optoelectronic device of the present invention.
Figure 9B:
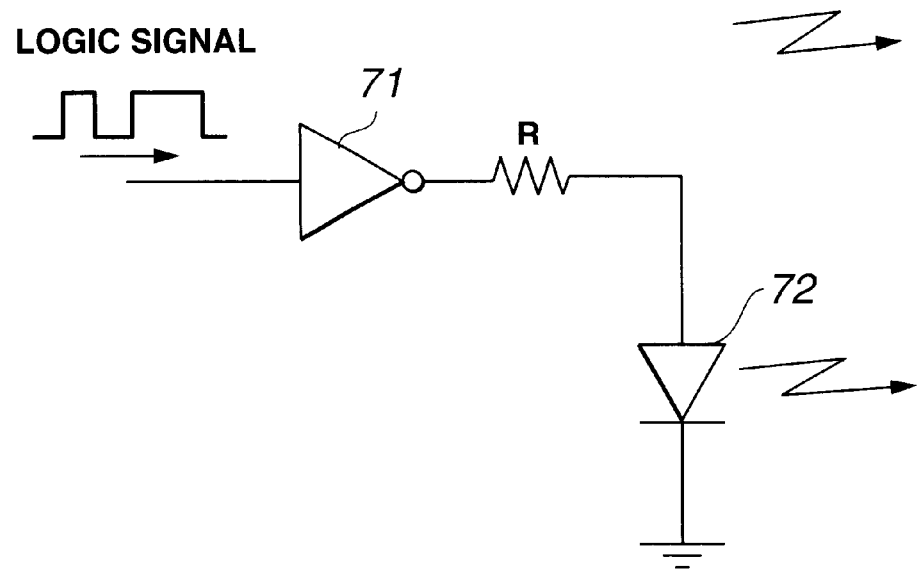

In the surface emitting laser, an output of about 100 μW can be obtained with an operating current of 3 mA. Furthermore, the laser can be well driven by a simple circuit which on/off-controls the laser using a CMOS buffer as illustrated in FIG. 9A or 9B. Therefore, only a resistor in series with the surface emitting laser needs to be connected to the MOS transistor at the output stage of a conventional LSI circuit in the common package. Thus, there is almost no need to modify the circuit structure of the LSI circuit, and the mixed optoelectronic wiring can be achieved at a very low cost. Here, where the laser has an output of 100 μW and the minimum sensitivity of the light receiving device is −25 dBm, an optical loss of up to 15 dB can be tolerated. This is a sufficient tolerance margin for a short-distance connection in a circuit board.

The first embodiment of the integrated optoelectronic device and the mixed optoelectronic wiring substrate will be next described in more detail. According to the present invention, typically, when an IC chip, such as a VLSI bare chip, and an optical device for information transmission are arranged in a common package, the package is implemented on a board with a united waveguide and electric wiring substrate, and the mixed optoelectronic wiring is implemented such that the speed of signal transmission is increased, the EMI is lowered, and the required electric power is reduced.

Figure 3:
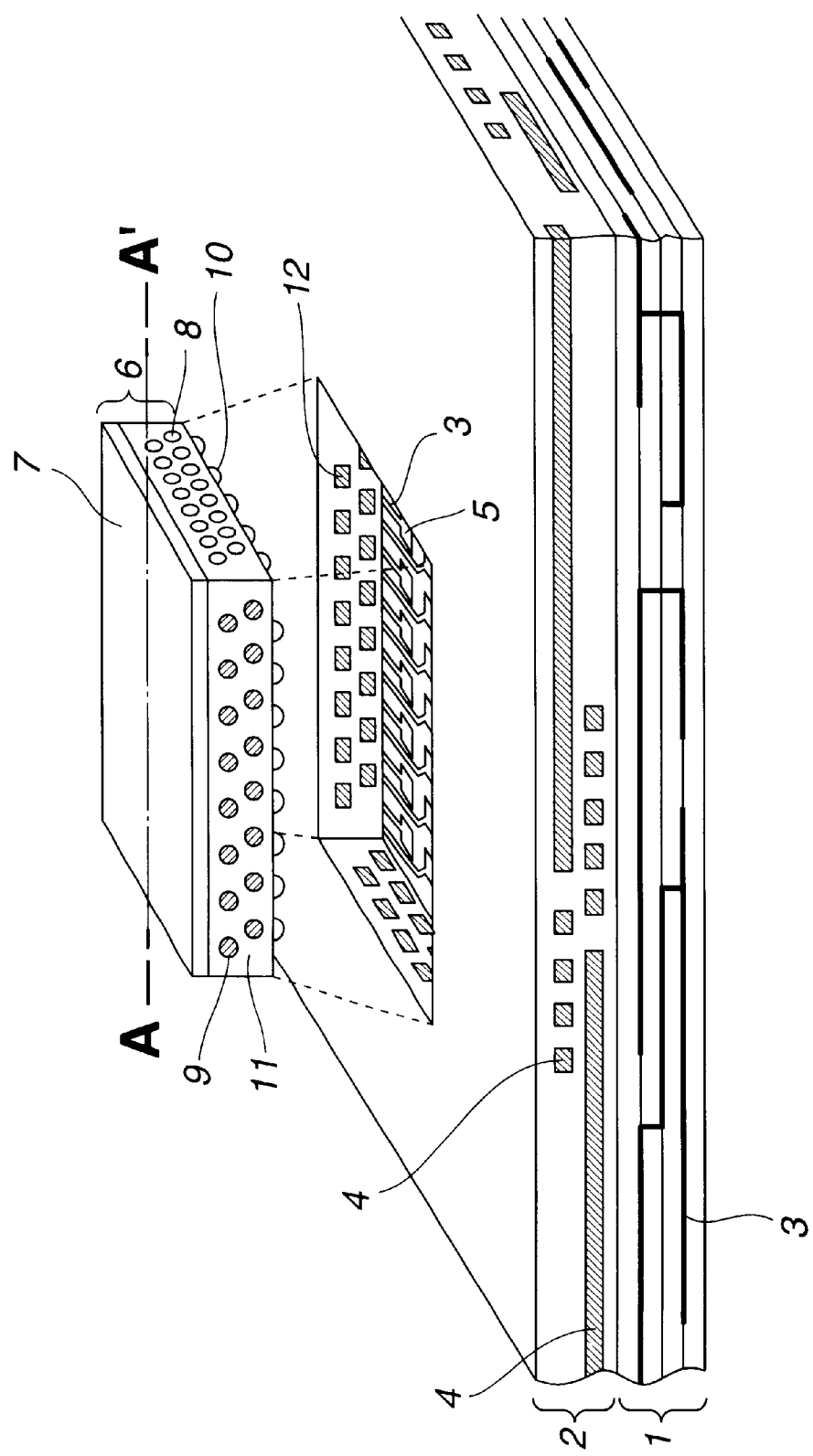
FIG. 3 is a perspective view of a first embodiment of an integrated optoelectronic device according to the present invention in which the integrated optoelectronic device and a mixed optoelectronic wiring substrate are illustrated in a separate state.

In the structure of FIG. 3, the multi-layer optical wiring layer 2 is laid down over the multi-layer wiring PCB 1 to form the mixed optoelectronic wiring substrate, windows for transmitting light therethrough are formed in a cover 11 of the integrated optoelectronic device 6, light emitting devices 9 and light receiving devices 8 are arrayed on the side surface of the BGA package corresponding to those windows, and the integrated optoelectronic device 6 is placed in a recess formed by partly removing the optical wiring layer 2 of the mixed optoelectronic wiring substrate. Accordingly, in the device 6 of the first embodiment, electric contact is perpendicularly established at the bottom of the recess, and optical coupling is horizontally achieved at a side face of the recess. There is further provided a thermally-conductive plate 7 which serves as a base for mounting the IC chip having the driving circuit for the optical devices 8 and 9 thereon. The plate 7 is formed of Al or Cu, for example, and heat-radiating means, such as a fin 59 (see FIG. 6A), can be bonded to its upper surface, if necessary.

The integrated optoelectronic device 6 is placed on the PCB 1 with solder balls 10 arrayed on the bottom electrode region of the device 6 being aligned with the corresponding electrodes 5 of the board 1, using the flip-chip implementation. Here, the positioning can be performed with a good yield due to the self-alignment effect at the time of reflow of the solder balls 10. When positioning is needed with more exact precision, a pin formed on the lower portion of the integrated optoelectronic device 6 may be inserted into a guide (not shown) formed on the PCB 1, for example. The BGA package may be replaced by a pin grid array (PGA) package, and this package may be put into a socket formed in the board 1.

In the above manner, when the integrated device 6 is mounted on the PCB 1 with electric contact being achieved, the input/output end faces 12 (exposed on the side surface of the recess) of the waveguides 4 formed above the board 1 as the optical wiring are self-aligned with the corresponding light emitting devices 9 and light receiving devices 8. Thus, positioning in a surface implementation fashion can be accomplished, and horizontal optical coupling is achieved. The electric signal is connected, through electric wiring 3 formed in the multi-layer wiring substrate 1, to another device and to an electric power source. The optical signal is connected to another device through the optical wiring of the waveguide 4.

In such a mixed optoelectronic wiring, the power supplied to the devices, and the relatively low speed logic signals and analog signals are carried by the electrical wiring 3, and the high-speed clock pulses and logic signals are transmitted by the optical wiring 4, for example. Such sharing is preferable. The numbers of the balls 10 and the optical devices 8 and 9 illustrated in FIG. 3 is shown only as an example, and the numbers of those structures are certainly not limited to those indicated in FIG. 3.

The multi-layer wiring substrate 1 for the electric wiring may as well be either a polyimide substrate, or a ceramic substrate such as an AlN substrate, besides a general-purpose PCB as discussed above. The waveguide layer 2 for the optical wiring is preferably formed of fluorine-contained PMMA, epoxy resin, polyimide or the like. A fabrication method of the waveguide layer 2 will be next described with reference to FIGS. 4A to 4C.

Figure 4A:
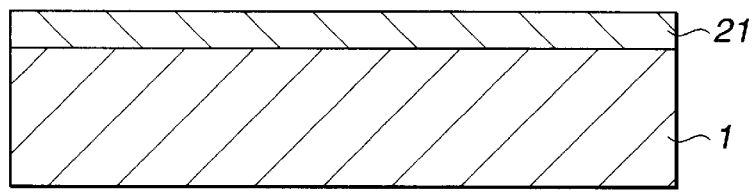
FIGS. 4A to 4C are cross-sectional views illustrating a fabrication method of the multi-layer optical wiring structure illustrated in FIG. 3.
Figure 4B:
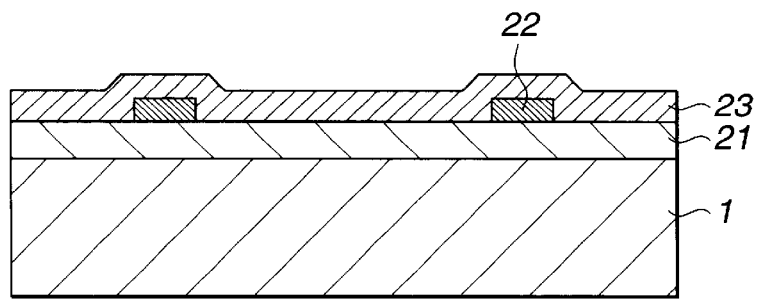
Figure 4C:
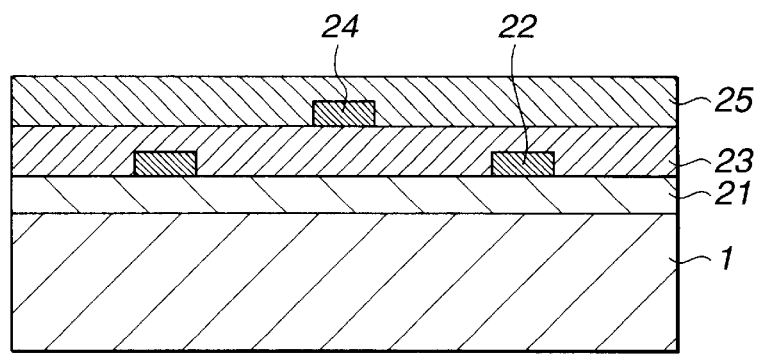

As illustrated in FIG. 4A, an optical resin 21, such as a polyimide, for forming a clad is initially coated on the electric wiring substrate 1 by using a spinner or the like, and then hardened. Thereafter, as illustrated in FIG. 4B, a layer 22 with a slightly-high refractive index for forming a core is coated, and the layer 22 is shaped into a waveguide pattern (for example, a cross section of 30 $\mu$m×30 $\mu$m) by photolithography and etching. Thus, the wiring pattern is formed, and this pattern is then buried by a clad 23. Where a multi-layer structure is to be constructed, after a flattening process by chemical mechanical polishing (CMP) a similar waveguide 24 is further formed and that waveguide 24 is then buried by another clad 25, as illustrated in FIG. 4C. Here, when a two-row array is to be formed, the waveguides 22 and 24 are preferably set off horizontally from one another, as illustrated in FIG. 4C, such that the clad 23 can be thinned, so as to achieve a high spatial efficiency. In the case of a two-layer structure, the total thickness of the waveguide layers 21, 23 and 25 is approximately 200 $\mu$m, for example.

The waveguide can be formed of various material, and silica glass (phospho-silicate glass (PSG)) is preferable as a low refractive-index material. Where PSG doped with P is used, the multi-layer optical wiring layer 2 (in FIG. 5) can be readily fabricated since the surface of the layer 2 is flattened due to mass transport when heated. In this case, when the refractive index of the core layer is controlled by using GPSG which is further doped with Ge, the waveguides 22 and 24 can be readily fabricated. The temperature for the heat flattening (reflow) is ordinarily high (about 800° C.). Therefore, the mixed optoelectronic substrate, i.e. the combination of 1 and 2 in FIG. 3, can be fabricated without any problem when after the waveguide is formed on a substrate of Si, or the like using the heat flattening process and so forth, the waveguide layers 21 to 25 are bonded to the electric wiring substrate 1 and the Si substrate is then removed. In FIG. 3, two optical wiring layers 2 are shown, but the number of the layers may be one or more than two.

Figure 5:
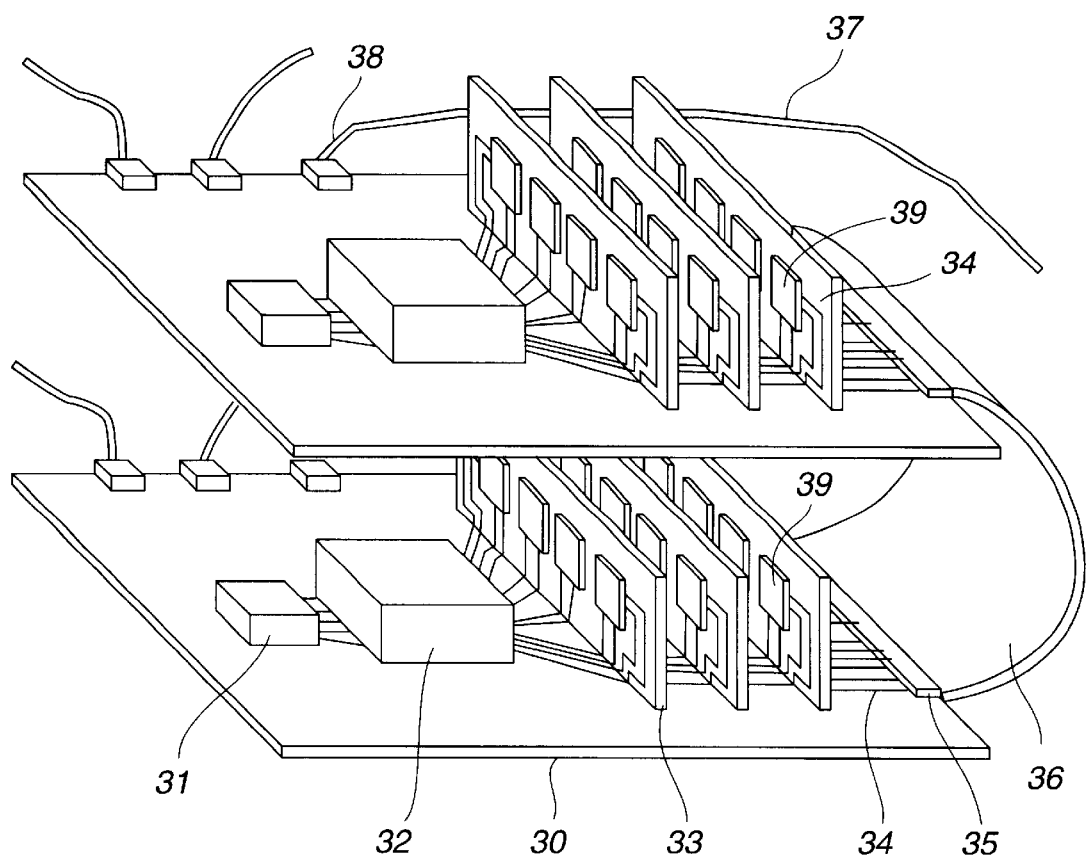
FIG. 5 is a perspective view illustrating a multi-chip-module (MCM) constructed by using the integrated optoelectronic device of the present invention and the mixed optoelectronic wiring substrate.

The entire structure of the thus-fabricated mixed optoelectronic board is illustrated in FIG. 5. In FIG. 5, reference numeral 30 indicates a mother board constructed as the above-discussed mixed optoelectronic substrate. Reference numeral 32 indicates a large scale central arithmetic processing unit (a microprocessor unit (MPU)). Reference numeral 31 indicates a primary cache memory. Reference numeral 33 indicates a structure in which an MCM with DRAMs 39 is mounted to the mother board 30 as a daughter board. The daughter board can also be constructed as the above-discussed mixed optoelectronic substrate. Each of the MPU 32, the primary cache memory 31, and the DRAM 39 can themselves be constructed as an integrated optoelectronic device 6 as illustrated in FIG. 3.

High speed logic and clock signals are transmitted through a waveguide 34 formed in the mother board 30 and the daughter board 33. Electric power lines and slow signals are connected through the electric wiring formed in the those boards 30 and 33. It is also possible to connect one board to another board through optical signals by using an optical connector 35 and a waveguide sheet 36. The waveguide sheet 36 is used as a bus line to transfer the optical signals in a parallel manner.

The optical connection between the mother board 30 and the daughter board 33 is carried out by a 45° mirror (not shown) formed at a port of the mother board 30 in which the daughter board 33 is to be inserted. Where the optical wiring is employed as a bus, an optical amplifier needs to be inserted at the connection portion to compensate for optical attenuation, or a light emitting device needs to be provided in the board as a repeater.

For the signal exchange with an exterior memory unit such as a hard disc drive, it is preferable to conduct serial rapid transfers using a connector 38 and a cable 37 at a relatively low cost. Therefore, a transmitting unit such as that used for optical-fiber transmission is provided in the connector 38 to perform a parallel-serial conversion and achieve a data transfer rate of about 10 Gbps. Although only the main portions of the boards are illustrated in FIG. 5, a next-generation computer with a clock rate of over several GHz can be constructed using the depicted structure by forming the necessary circuit structure.

In the above board, as compared with the case using the Rambus system, limitations to the wiring and pins are small, faster and smaller structures are possible, the required electric power can be reduced, and the problem of EMI can be readily solved. Furthermore, since still faster and smaller constructions are required by, and a further decrease in EMI is indispensable, in recent generations of standard electronic devices, such as computers, portable phones and digital cameras, the mixed optoelectronic system of the present invention is quite effective for use in those devices.

Figures 6A, 6B:
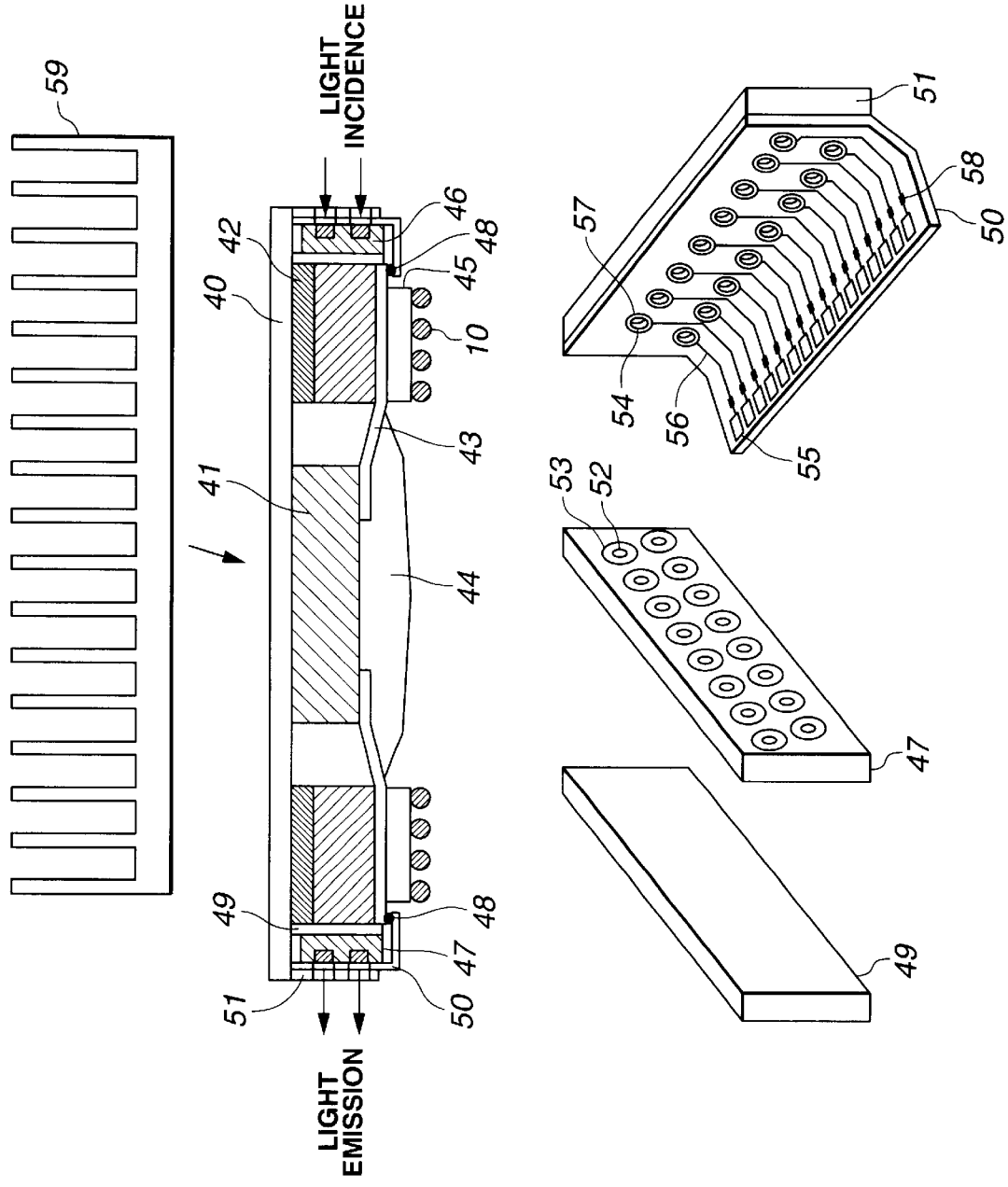
FIG. 6A is a cross-sectional view of the integrated optoelectronic device of the first embodiment, taken along the line A–A' in FIG. 3.
FIG. 6B is a perspective view of a portion of an array of optical devices of the first embodiment.

The structure of the integrated optoelectronic device 6 of the first embodiment will be now described in detail with reference to FIGS. 6A and 6B. FIG. 6A illustrates a cross section of the first embodiment of the integrated optoelectronic device taken along the line A–A' in FIG. 3, and FIG. 6B is a broken-up perspective view of a portion of the array of the optical devices of the first embodiment.

In the device 6 (FIG. 3), the BGA package is used, and the bottom surface of a Si-LSI circuit 41 (FIG. 6A) is bonded to a central portion of the base plate 40 formed of Cu. Electrodes for putting the solder balls 10 thereon are formed on a plate 45, and the wiring between these electrodes and surface electrodes of the Si-LSI circuit 41 is established by inner leads 43. In FIG. 6A, the inner leads 43 are so depicted as to be connected to electrodes of optical devices 46 and 47, but a part of the inner leads 43 is used to connect the solder ball 10 to the electrode of the Si-LSI circuit 41. A supporter base 42 is provided to support the plate 45 for constructing the BGA electrode and the inner lead 43. The base 42 is formed of thermally-conductive ceramics, such as $Al_2O_3$ and AlN, or metal, and bonded to the base plate 40 and the inner lead 43. The inner leads 43 are arranged in a dense array or in a spaced manner. The spacer base 42 is bonded to the base plate 40 with a thermally-conductive adhesive.

In FIG. 6A, there is formed a space between the Si-LSI circuit 41 and the supporter base 42, but the space may be filled with resin or the like. The surface of the LSI circuit 41 is covered with a resin 44 to protect this surface. Heat generated in the Si-LSI circuit 41 and the optical devices 46 and 47 can be radiated to the air through the base plate 40. If necessary, a heat-radiating fin 59 may be bonded onto the base plate 40 as illustrated in FIG. 6A.

Exemplary of the above structure are 1 cm for the Si-LSI circuit 41, and 1 cm for the distance between the Si-LSI circuit 41 and the optical devices 46 and 47. When the frequencies (wavelengths) of electric signals to be treated are considered, such values cause no problem as to signal delay or skew.

In the structure of the optical device 47, there are a supporter plate 49, a surface light emitting device 47, and a cover plate 51. As well, a flexible wiring tape 50, such as a tape automated bonding (TAB) tape, is stacked with the above structures in the order illustrated in FIG. 6B. The structure of the optical device 46 (light receiving device) is the same as that of the optical device 47.

The supporter plate 49 is bonded to the side surface of the supporter base 42 (as shown in FIG. 6A), and electrodes 55 on the TAB tape 50 and a common electrode on the surface of the supporter plate 49 are electrically connected to the corresponding inner leads 43 by a solder 48 or the like. Windows 57 are formed in the TAB tape 50 and the cover plate 51 at portions corresponding to the respective surface optical devices 47 to pass light therethrough. The window 57 may be simply a hole, or a light-condensing lens or protective transparent plate fitted into the hole. A ring electrode 53 on a light emitting portion 52 (or a light receiving portion in the case of the light receiving device 46) is bonded to a ring electrode 54 on the TAB tape 50, and current injection into or voltage application to the optical devices 47 is independently carried out through the electric wiring 56.

It is preferable to form the plates 49 and 51 and the TAB tape 50 out of material with good thermal conductivity for effective heat radiation of the optical device. The plates 49 and 51 are formed of metal or a ceramic thin film of $Al_2O_3$, and the TAB tape 50 is formed of a polyimide film containing $Al_2O_3$ powders. The surface light emitting device 47 is comprised of a surface emitting laser with good radiation efficiency. The light radiation angle of the surface emitting laser is small, for example less than 10°, and therefore, even if no lens is used, the laser can be optically coupled to the waveguide 4 (in FIG. 3) with only a small light loss.

The surface emitting laser 47 is ordinarily formed where a structure sandwiching a cavity with an active layer between distributed Bragg reflector (DBR) mirrors is epitaxially grown on an n-type substrate and a current constricting structure is provided to attain a current flow only into its light radiating portion. Such lasers 47 can be readily arranged in a two-dimensional array as illustrated in FIG. 6B. In this embodiment, an AlAs/AlGaAs multi-layer epitaxial mirror is grown on a GaAs substrate, and an 830-nm band surface emitting laser with a GaAs/AlGaAs multiple quantum well active layer is fabricated.

In the above described structure, the common electrode is a cathode, and the electrode 53 for independent driving is an anode. FIG. 9B illustrates an E/O converting portion for driving a surface emitting laser 72. A portion connected to a last-stage electrode of the LSI circuit 41 as shown in FIG. 6A, normally includes a CMOS buffer inverter 71, as shown in FIG. 9B, to carry out a current driving through a pin. In this embodiment, however, the last-stage construction is unchanged, and the E/O conversion is achieved by the surface emitting laser 72 to output light, in place of forming the pin. The driving-current capability of the CMOS buffer is normally less than 10 mA, and this capability is sufficient here since the threshold current and operating current for an output of 100 µW are very low, approximately 1 mA and 3 mA, respectively. When a current of 3 mA injected into the surface emitting laser 72, its operating voltage is approximately 2.5 V. Accordingly, in the case of the CMOS buffer 71 with a 3.3 V serving, the serial resistor R to be inserted only needs to have a resistance of $267\Omega(=(3.3-2.5)/3\times10^{-3})$. The resistor R can either be inserted into the wiring 56 on the TAB tape 50 as indicated by numeral 58 in FIG. 6B, or into the inner lead 43 (not shown). In this system, however, there is a limitation on the maximum switching speed since the switching time of the p-channel of the CMOS buffer 71 is dominant due to its common-cathode operation.

In contrast, in the case of a common-anode structure as illustrated in FIG. 9A, high-speed operation can be more easily achieved because the switching time of the n-channel of the CMOS buffer 71 is dominant. Therefore, in this embodiment, it is possible to remove the n-substrate of the surface emitting laser and separate the n-side electrode to achieve the common-anode system. FIGS. 7A to 7D illustrate its fabrication method as shall be next described.

Figure 7A:
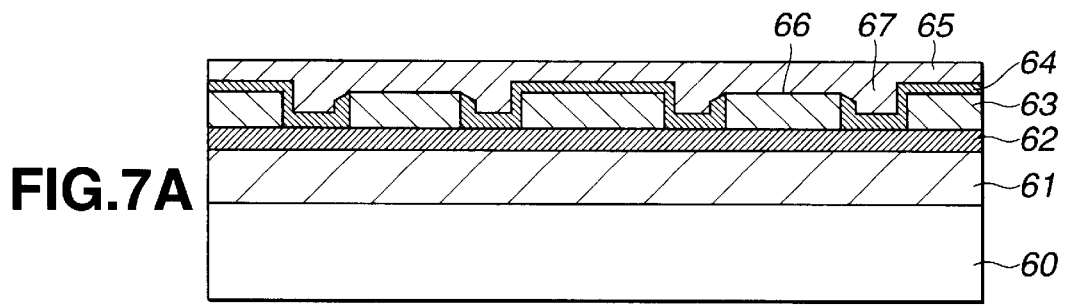
FIGS. 7A to 7D are cross-sectional views illustrating a fabrication method of a surface emitting laser with only its functional layer left.

For simplicity, only two arrayed surface emitting lasers are illustrated in FIGS. 7A to 7D. As illustrated in FIG. 7A, after an n-AlAs layer (not shown) of an etch stop layer and an n-GaAs layer (not shown) of a contact layer are grown on an n-GaAs layer 60, then an n-AlAs/AlGaAs multi-layer mirror 61, a one-wavelength cavity 62 consisting of an undoped GaAs/AlGaAs multiple quantum well active layer and an AlGaAs layer, and a p-AlAs/AlGaAs multi-layer mirror 63 are epitaxially grown using a metal organic-chemical vapor deposition (MO-CVD) or the like. An annual recess 67 is then formed by etching to form a current constricting layer 66. An insulating layer 64 of $SiN_x$. is laid over the wafer, except for the light radiating region, and a common p-side electrode 65 is formed.

Figure 7B:
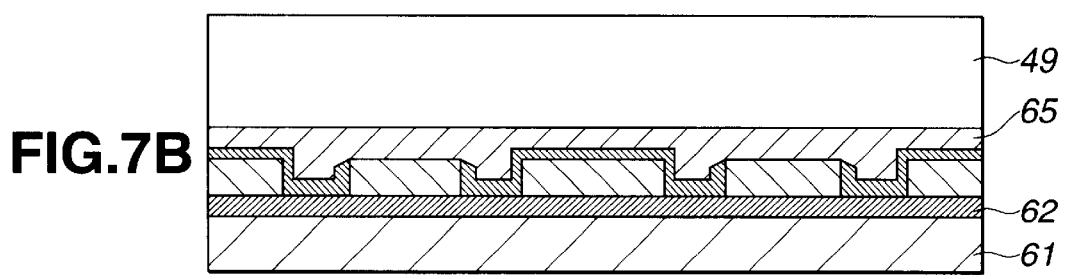

As illustrated in FIG. 7B, after the p-side electrode 65 is entirely bonded to an overall electrode (not shown) of the supporter plate 49 with an AuSn solder, the GaAs substrate 60 is removed by polishing and chemical etching. Here, a mixture solution of $H_2O_2$ and $NH_3$ is used as an etchant, and hence, the etching can be stopped at the AlAs layer grown on the GaAs substrate 60. Immediately thereafter, the AlAs layer is removed by HCl to expose the GaAs layer grown as a lowermost layer of the mirror 61.

Figure 7C:
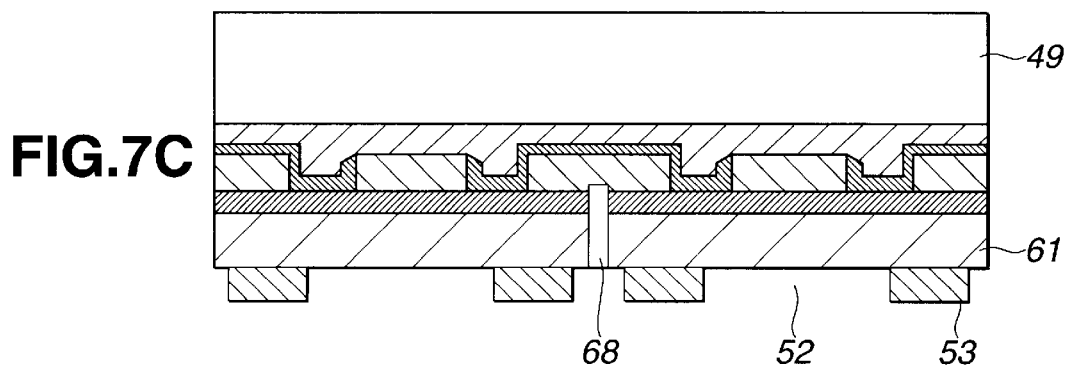
Figure 7D:
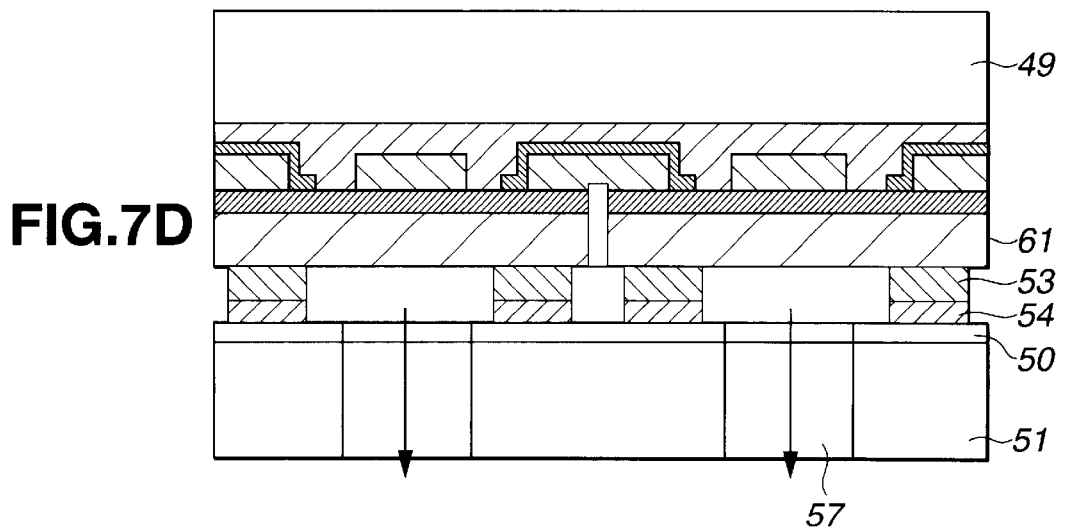

As illustrated in FIG. 7C, inter-device portions of the exposed mirror layer 61 are then wet-etched by an etchant of sulfuric-acid series to form a separating groove 68, and the n-side electrode 53 with the window 52 is formed for each optical device (see FIG. 6B).

The TAB tape 50, as shown in FIG. 6B, with the electrodes 54 is then bonded to the cover plate 51 with the windows 57, and the electrode 54 and the electrode 53 of the surface emitting laser 47 are bonded to each other with an AuSn solder. There can be thus provided an array of common-anode surface emitting lasers whose light can be output through the window 57.

Figure 8A:
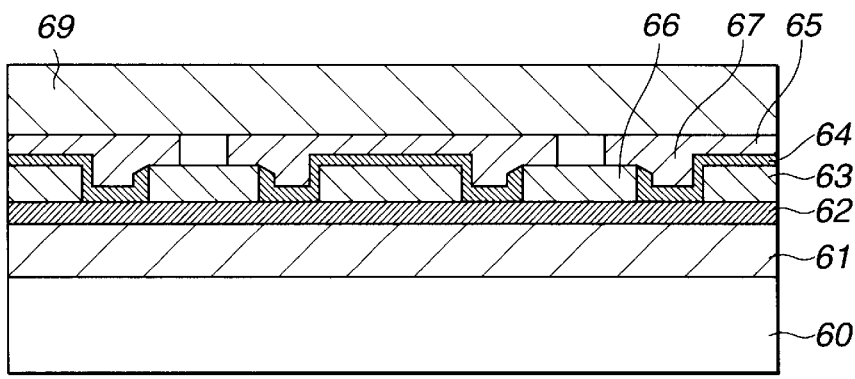
FIGS. 8A to 8C are cross-sectional views illustrating another fabrication method of a surface emitting laser with only its functional layer left.
Figure 8B:
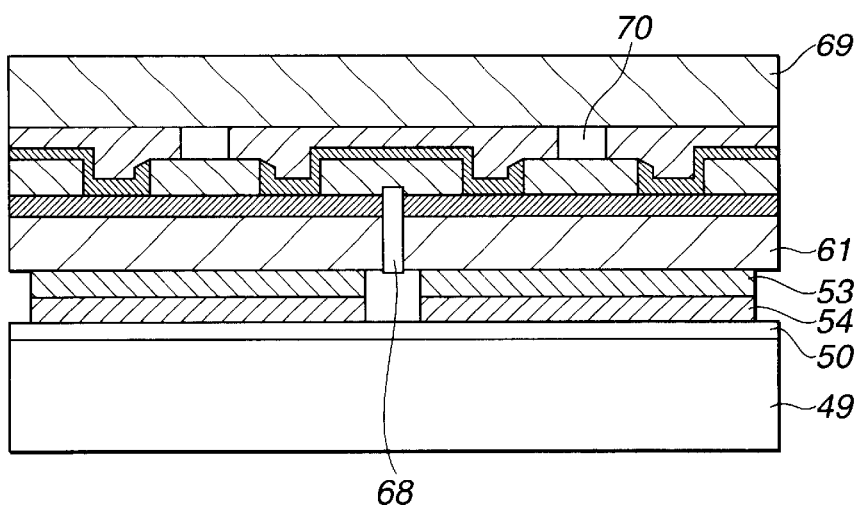
Figure 8C:
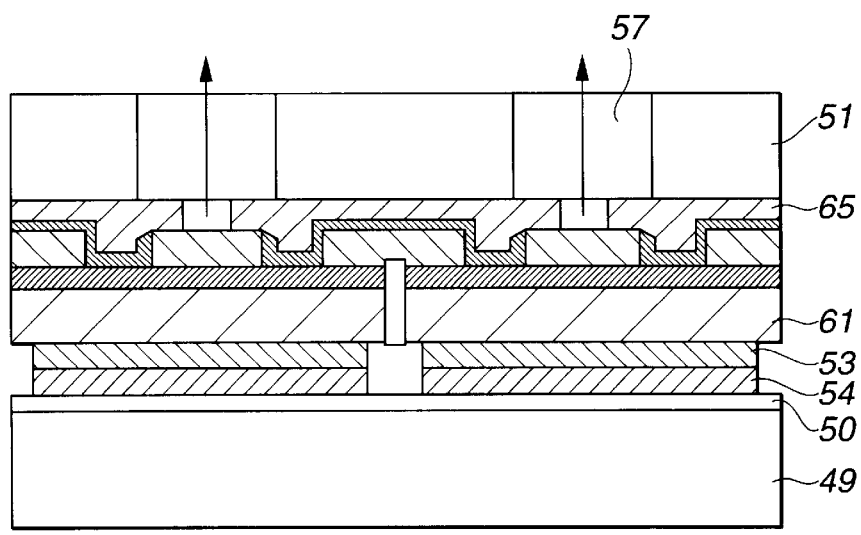

A slightly different construction can also be fabricated by the fabrication method as illustrated in FIGS. 8A to 8C. In this structure, the TAB tape 50 for wiring is attached on the side of the supporter plate 49, in a structure somewhat different than the structure of FIGS. 6A and 6B.

In FIG. 8A, the surface emitting laser is fabricated similarly as in the case of FIG. 7A, but a window 70 for passing light is opened in the p-side electrode 65 to emit light from the p-side mirror layer 63. Furthermore, the p-side is bonded to a quartz glass plate 69 with electron wax or the like.

As illustrated in FIG. 8B, the GaAs substrate 60 is then removed and an electrode 53 without a window is formed for each device, in a similar manner as depicted in FIG. 7C. The supporter plate 49 is then bonded to the TAB tape 50, and each electrode 54 without a window on the TAB tape 50 is connected to the electrode 53 of the laser. There is no need to open the window in the electrode 54 since light is not emitted from this side. The p-side is bonded to the above quartz glass plate 69 to facilitate such emission.

As illustrated in FIG. 8C, the glass plate 69 is then removed, and the surface plate 51 is mounted here. In such a structure without the GaAs substrate 60, the functional layer for oscillating the laser light is sandwiched between the two structures 49 and 51. Accordingly, when those structures, i.e., 49 and 51, are formed of material having a large thermal conductivity, characteristics of the laser can be further enhanced. Furthermore, the inclusion ratio of As in the construction can be largely reduced, and thus environmental safety is enhanced.

A light emitting diode (LED) can be used as the surface light emitting device, but in this case the operating current goes up by one order of magnitude to about 30 mA, as compared with the surface emitting laser. The required electric power is thus increased, and hence, its driver portion needs to be modified.

In the above description, the surface light receiving device is not described in detail, but its construction and fabrication method are similar to those of the surface light emitting device. A p-i-n structure of GaAs is fabricated by using, for example, an epitaxial growth and diffusion process. Si or InGaAs may also be used.

In the foregoing, the example of 830-nm band is described, but an InGaAs structure of 0.98-$\mu$m band, an InGaAsP structure of 1.3-$\mu$m band, or the like, can also be employed.

(Second Embodiment)

Figure 10A:
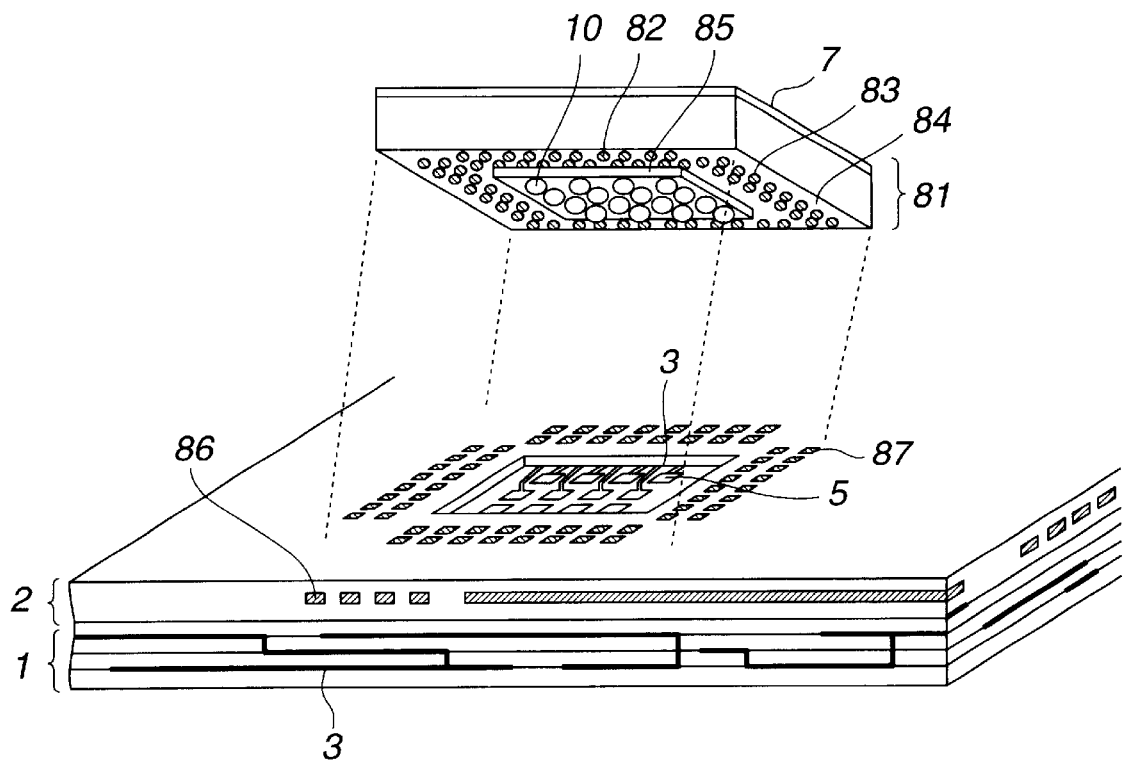
FIG. 10A is a perspective view of a second embodiment of the present invention in which an integrated optoelectronic device and a mixed optoelectronic wiring substrate are illustrated in a separate state.
Figure 10B:
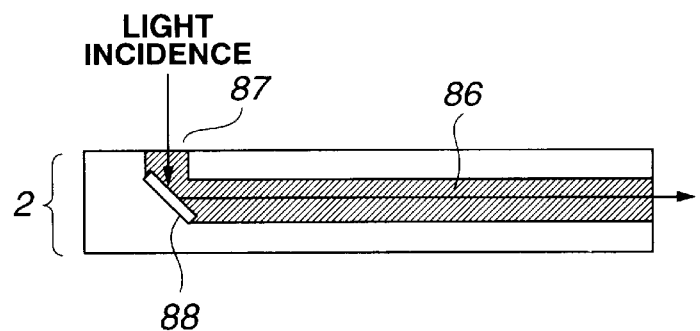
FIG. 10B is a cross-sectional view of a waveguide in the second embodiment of the present invention.

A second embodiment is directed to the combination of an integrated optoelectronic device and a mixed optoelectronic wiring substrate. In the second embodiment of the present invention, the direction of the input and output light of optical devices 82 and 83 in the integrated optoelectronic device 81 (as depicted in FIG. 10A) is perpendicular to the mixed optoelectronic wiring substrate 1 and 2, as illustrated in FIGS. 10A and 10B. A 45° mirror 88 is formed in a waveguide 86 as illustrated in FIG. 10B. Light coupled to the mixed optoelectronic wiring substrate through an input/output interface 87 and a mirror 88 propagates horizontally along the waveguide 86, and light propagating horizontally along the waveguide 86 and coupled to the integrated optoelectronic device 81 through the mirror 88 and the interface 87 is emitted vertically. The structure of the waveguide 86 may be the same as that of the first embodiment. In the second embodiment, there is provided only one optical wiring layer 2 in the mixed optoelectronic wiring substrate.

The type of the integrated optoelectronic device 81 formed on the base plate 7 is a $\mu$-BGA (or chip size package (CSP)) which has the ball array 10 for electrical contact at its central portion, as illustrated in FIG. 10A, and the device 81 includes an array of downward-oriented light emitting devices 82 and light receiving devices 83 along its peripheral region. The optical devices 82 and 83 are covered with a cover plate 84 with windows for passing light therethrough, their surfaces being thus protected.

The manner of implementation of this embodiment is the same as that of the first embodiment. The optical devices 82 and 83 are thus self-aligned with the input/output interfaces 87 of the optical wiring layer 2. The integrated optoelectronic device 81 has a central region which contacts with the electrodes 5 of the electrical wiring substrate 1 having the wiring 3, through the ball grid array 10. In this region, a base portion 85 protrudes from a surface of the optical devices 82 and 83 by the thickness (about 100 $\mu$m, for example) of the optical wiring layer 2. The diameter of a solder ball is about 50 $\mu$m, for example, and the thickness of the solder portion after the reflow bonding is about 20 $\mu$m, for example. Therefore, when the protruding base portion 85 is about 100 $\mu$m in height, the distance between the optical devices 82 and 83 and the input/output interfaces 87 is approximately 20 $\mu$m.

Figure 11:
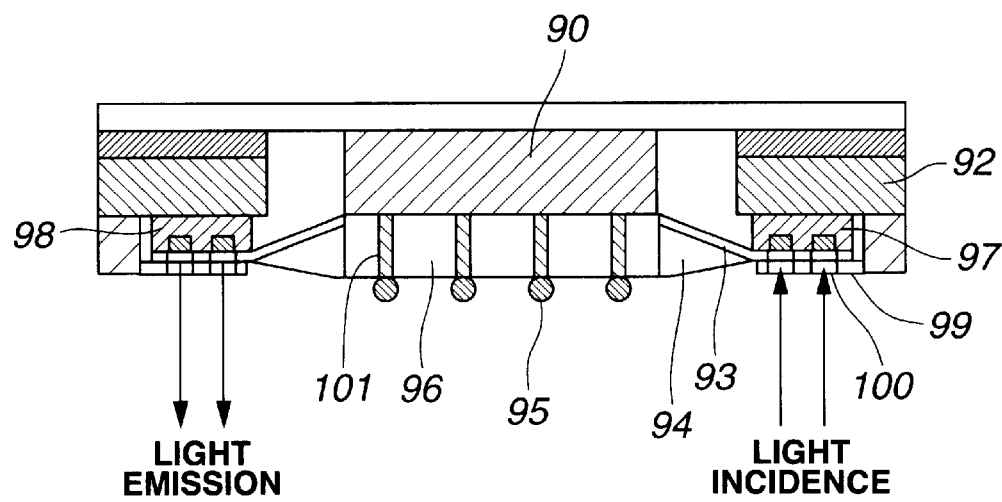
FIG. 11 is a cross-sectional view of a first configuration of the integrated optoelectronic device in the second embodiment of the present invention.
Figure 12A:
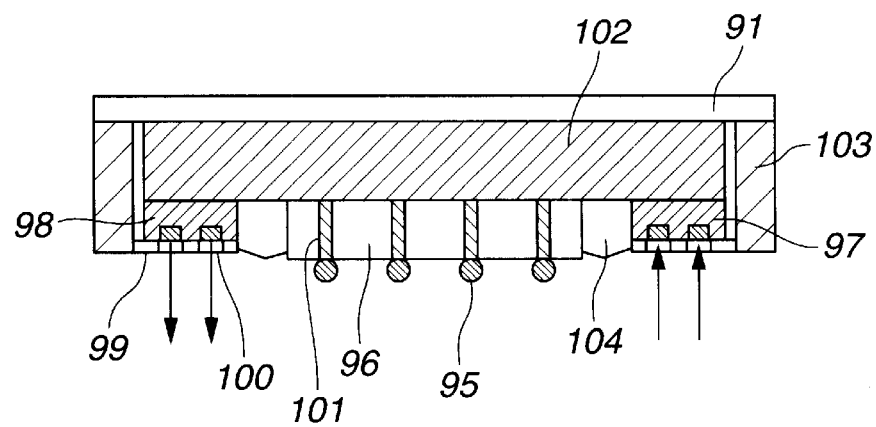
FIG. 12A is a cross-sectional view of a second configuration of the integrated optoelectronic device in the second embodiment of the present invention in which a surface emitting laser and an LSI circuit are provided on a common substrate.
Figure 12B:
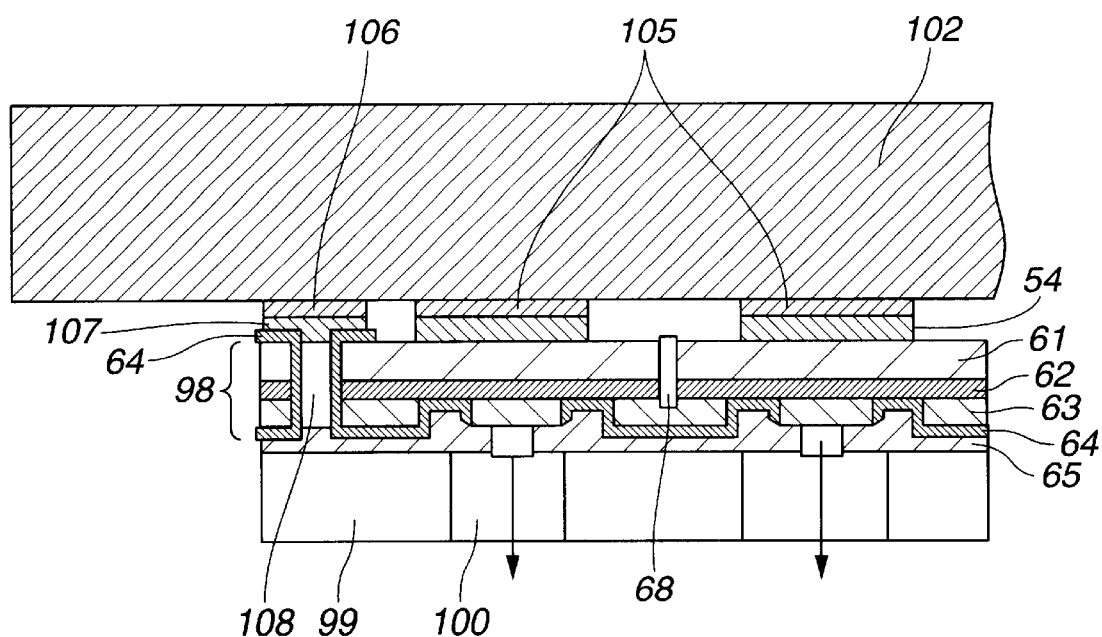
FIG. 12B is a cross-sectional view of a portion of an array of surface emitting lasers in FIG. 12A.

Two specific structures of the above-described integrated optoelectronic device 81 are illustrated in FIGS. 11, and 12A and 12B, respectively.

In the structure depicted in FIG. 11, in a similar manner as in the first embodiment, surface emitting lasers 98 and surface light receiving devices 97 are arranged with their common electrodes being bonded to a supporter plate 92. The common electrode is connected to a Si-LSI circuit 90 through appropriate wiring such as an inner lead 93. The supporter plate 92 is bonded to a base plate 91 such that the light input to and output from the optical devices 97 and 98 propagate in a direction perpendicular to the base plate 91. Separated individual electrodes of the optical devices 97 and 98 are connected to the Si-LSI circuit 90 by corresponding inner leads 93, and windows 100 for passing light are formed in a cover plate 99. Solder balls 95 for electric connection to the electric wiring board 1 are arranged on a supporter composed of an insulating layer 96 of polyimide or the like, and connected to the LSI 90 by through-hole electrodes 101 formed in the insulating layer 96. The periphery of the insulating layer 96 is covered with a resin 94 to protect the inner leads 93.

Figure 2A:
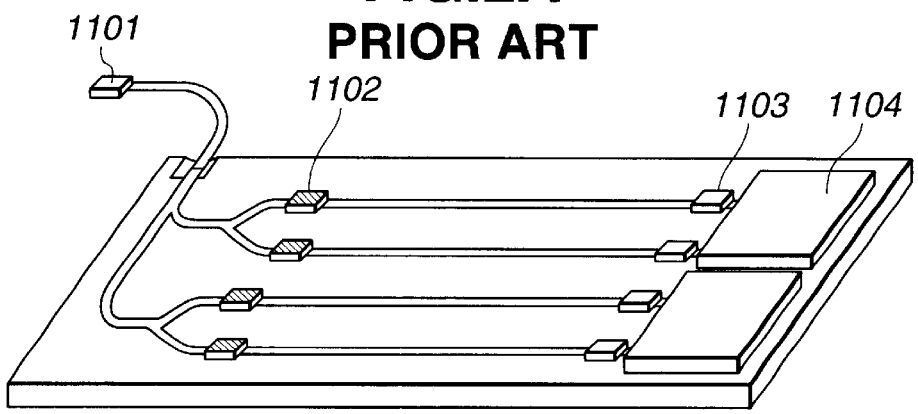
FIGS. 2A to 2C are perspective views illustrating a second prior art device.
Figure 2B:
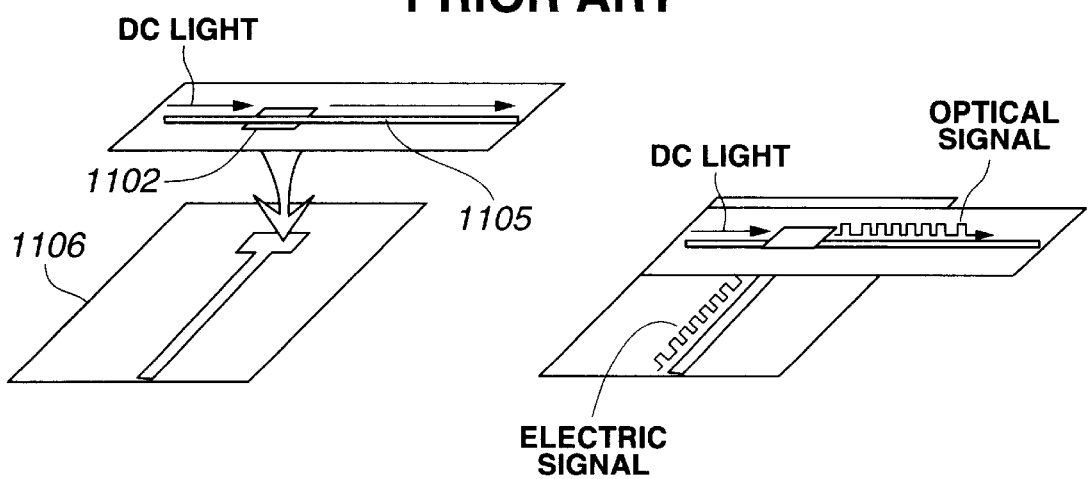
Figure 2C:
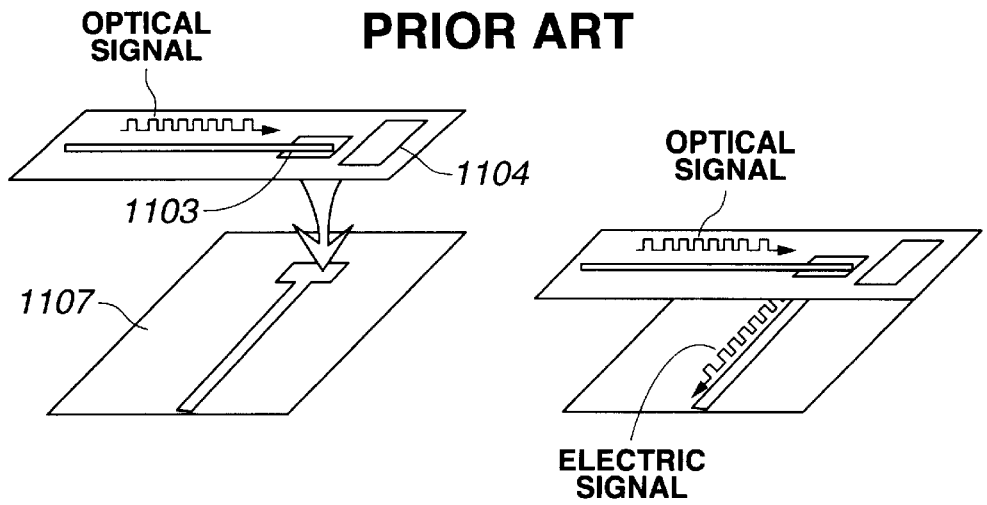

In the structure of FIGS. 12A and 12B, a region without an electric circuit is formed on a Si-LSI 102, and optical devices 97 and 98 are implemented directly on a bare chip (a die) of the LSI 102. Thus, inner leads are omitted. In FIG. 12A, elements with the same functions as those in FIG. 11 are designated by the same reference numerals. Also in the structure of FIGS. 12A and 2B, the edge of the cover plate 99 is protected by a structure 103 bonded to the base plate 91, and the periphery of the insulating layer 96 is covered with a resin 104.

As illustrated in FIG. 12B, which is an enlarged view of a part of the light emitting devices 98, electrode wiring 105 for driving the optical device 98 is formed on the Si-LSI 102, and the electrodes 54 of the optical devices 98 are implemented on the electrode wiring 105 in a flip-chip manner such that the optical devices 98 can be independently driven. The surface emitting laser 98 is fabricated by the method as illustrated in FIGS. 8A to 8C. In FIG. 12B, elements with the same functions as those in FIGS. 8A to 8C are designated by the same reference numerals, with the exception that the common electrode 65 is taken to the same surface as that of the separated electrodes 54 through a through-hole wiring structure 108 formed in the optical device and an electrode 107 is thus formed. Thus, the optical devices are implemented on the Si substrate 102 with the connection of both the cathode 105 and an anode 106 being achieved, and hence, no inner leads are needed. Accordingly, simplification of the structure and fabrication process, as well as cost reductions can be attained, and moreover, high-speed driving of the optical device can be achieved.

In the above structures, the functional layer of the surface emitting laser 98 is thin, approximately 5 to 7 μm, for example, as a result of the GaAs substrate being removed. Accordingly, a metal film, or a dielectric of $Al_2O_3$, or the like, with good thermal conductivity having a thickness of approximately 20 to 30 μm is bonded to the cover plate 99. In the case where the degree of integration is large and the array number of optical devices is great, however, it is preferable that optical devices 97 and 98 and the LSI 102 be separated and arranged in proximity to each other, as in the first embodiment, or as depicted in the structure of FIG. 11, in light of the problem of thermal interference therebetween.

(Third Embodiment)

Figure 13:
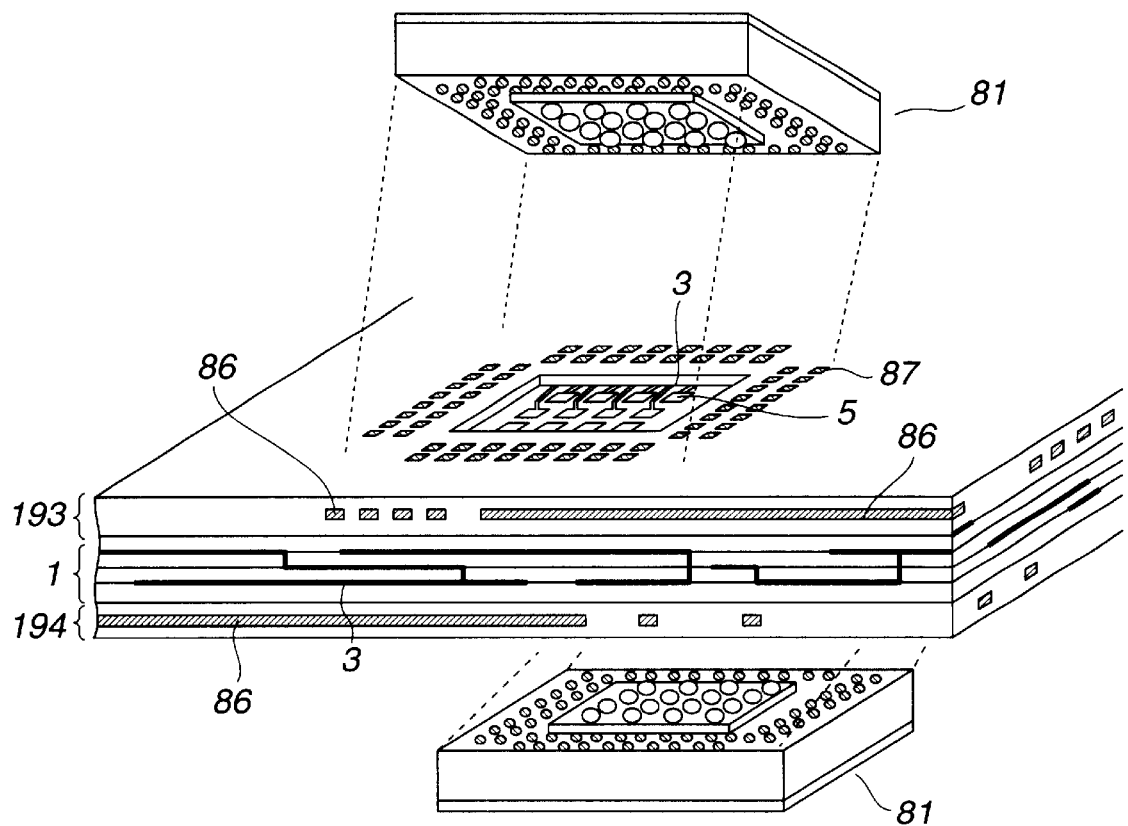
FIG. 13 is a perspective view of a third embodiment of the present invention in which integrated optoelectronic devices and a mixed optoelectronic wiring substrate are illustrated in a separate state.

In a third embodiment of the present invention, with reference to FIG. 13, there are provided optical wiring layers 193 and 194 with waveguides 86 on the opposite surfaces of the multi-layer electric wiring substrate 1 with the electric wiring 3, and integrated optoelectronic devices 81 implemented on both the optical wiring layers 193 and 194, as illustrated in FIG. 13. The implementation density on the substrate is hence increased. Structures of the electric wiring substrate 1 and the integrated optoelectronic device 81 are the same as those described in connection with the first and second embodiments. Elements having the same functions as those of the first or second embodiment are thus designated by the same reference numerals, or such reference numerals are omitted in FIG. 13.

Figure 14:
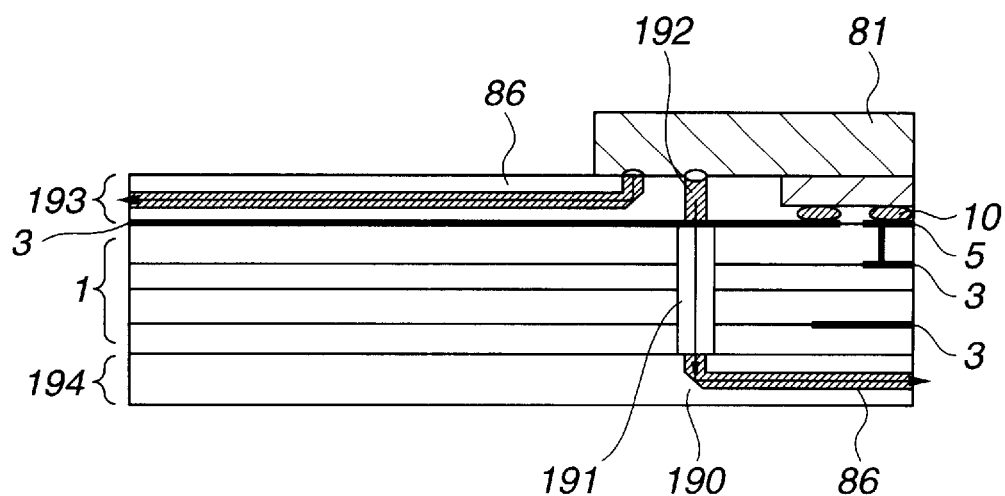
FIG. 14 is a cross-sectional view of the optical wiring of the mixed optoelectronic wiring substrate in the third embodiment.

The third embodiment has the feature that the optical wiring vias disposed between the opposite sides of the electric wiring substrate 1 are accomplished by through-hole waveguides 191 formed in the substrate 1, as illustrated in FIG. 14. Light emitted from the integrated optoelectronic device 81 travels through a waveguide 192 of the upper optical wiring layer 193 and the through hole 191, and is coupled to the waveguide 86 by a 45° mirror 190 provided in the lower optical wiring layer 194. This structure is similarly used for the light reception into the device. The through hole 191 may be a simple void hole, or a hole filled with the same material as a core of the waveguide 192. Where the diameter of the through hole 191 is set to about 100 μm, for example, there occurs almost no light loss due to diffraction and reflection when the thickness of the electric wiring substrate 1 is about 5 mm.

According to the above structure, the degree of freedom of wiring is increased, and a compact high-density MCM module for electric equipment, which can readily cope with the problem of EMI, can be provided.

In the third embodiment, the electrical wiring substrate 1 is sandwiched between the optical wiring layers 193 and 194, but a structure of alternately-layered electric wiring layers and optical wiring layers can be adopted as well.

Furthermore, the direction of light input and output of the optical devices is shown as being along the vertical or horizontal directions in the above structures, but the propagation direction may also be at an angle. In such case, the connection to another device or board can be performed using spatial propagation, a waveguide tube, a waveguide film, or the like.

The package configuration of the integrated optoelectronic device is not limited to those discussed above, but all configurations, such as a quad flat package (QFP) or a dual in-line package (DIP), can also be employed. Further, in the above structures, only one LSI chip substrate is mounted in the package, but a three-dimensionally stacked LSI circuit in a CSP implementation, or a three-dimensional LSI circuit on a Si substrate using multi-layer wiring techniques can also be used.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. An integrated circuit device comprising:

an integrated optoelectronic device including an electrode region formed on a central portion of its bottom surface and an optical device region formed around said electrode region, said electrode region having a protruding configuration; and a plate member, including an electrical wiring substrate and an optical wiring layer provided on said electrical wiring substrate, said plate member having a recess, and said protruding configuration being inserted in said recess.

2. The integrated circuit device of claim 1, wherein said optical wiring layer is provided on each of upper and lower surfaces of said electrical wiring substrate, and said integrated optoelectronic device is placed on each of said optical wiring layers.

3. The integrated circuit device of claim 2, wherein said electrical wiring substrate has a through-hole waveguide for optically coupling said optical wiring layers one to another.

4. The integrated circuit device of claim 1, wherein said protruding configuration has a height corresponding to a thickness of said optical wiring layer.

5. The integrated circuit device of claim 1, wherein said optical device region comprises a surface light emitting device.

6. The integrated circuit device of claim 1, wherein said optical device region does not contact said plate member.

* * * * *